United States Patent
Iwasaki

(10) Patent No.: US 11,302,370 B2
(45) Date of Patent: Apr. 12, 2022

(54) SEMICONDUCTOR APPARATUS AND SYNCHRONIZATION METHOD

(71) Applicant: FUJITSU LIMITED, Kawasaki (JP)

(72) Inventor: Shinichi Iwasaki, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 17/182,979

(22) Filed: Feb. 23, 2021

(65) Prior Publication Data
US 2021/0319817 A1 Oct. 14, 2021

(30) Foreign Application Priority Data
Apr. 13, 2020 (JP) .............................. JP2020-071580

(51) Int. Cl.
*G11C 7/10* (2006.01)
*G11C 7/22* (2006.01)

(52) U.S. Cl.
CPC ............ *G11C 7/222* (2013.01); *G11C 7/1057* (2013.01); *G11C 7/1066* (2013.01); *G11C 7/1084* (2013.01); *G11C 7/1093* (2013.01)

(58) Field of Classification Search
CPC .................................. G11C 7/222; G11C 7/10
USPC ........................................... 365/223.1, 233.1
See application file for complete search history.

(56) References Cited

U.S. PATENT DOCUMENTS

| | | | | |
|---|---|---|---|---|
| 6,240,524 B1* | 5/2001 | Suzuki | ....................... | G06F 1/10 713/500 |
| 7,444,491 B1* | 10/2008 | Steinbusch | ............... | G06F 5/06 711/170 |
| 7,519,747 B1* | 4/2009 | Cory | ......................... | G06F 5/10 710/52 |
| 8,621,101 B1* | 12/2013 | Starr | ....................... | H04L 67/28 709/235 |
| 2008/0114825 A1* | 5/2008 | Oyama | .............. | H03H 17/0628 708/490 |
| 2008/0180579 A1* | 7/2008 | Maxim | .................. | H04B 1/001 348/735 |

FOREIGN PATENT DOCUMENTS

JP H10-340130 A 12/1998

* cited by examiner

*Primary Examiner* — Muna A Techane
(74) *Attorney, Agent, or Firm* — ArentFox Schiff LLP

(57) ABSTRACT

Data is synchronized when transmitted from a circuit operated at first frequency to another circuit operated at second frequency. A synchronization method includes storing data write pointers in a line, storing data input from a source at first frequency at a location in a data buffer designated by the write pointer at one end of the line, taking out the write pointer at the one end from the line to store it in the synchronization buffer, synchronizing a validation signal input from the input source at first frequency to second frequency, reading out the write pointer stored in the synchronization buffer when the validation signal is synchronized, adding completion information that indicates completion of synchronization to the data stored at the location in the data buffer designated by the read out write pointer, and reading out, from the data buffer, the data to which the completion information is added.

5 Claims, 3 Drawing Sheets

SEMICONDUCTOR APPARATUS AND SYNCHRONIZATION METHOD

CROSS-REFERENCE TO RELATED APPLICATION

This application is based upon and claims the benefit of priority of the prior Japanese Patent Application No. 2020-71580, filed on Apr. 13, 2020, the entire contents of which are incorporated herein by reference.

FIELD

The embodiments discussed herein are related to a semiconductor apparatus and a synchronization method.

BACKGROUND

The current system on a chip (SoC) is designed by combining a plurality of circuits that are grouped into a functional unit called intellectual property (IP). Each IP may operate at a different frequency. Therefore, it is important to solve a synchronization problem at the time of data transfer between IPs in order to design by combining IPs.

In order to solve such a frequency synchronization problem, various techniques have been proposed. In the synchronization, in order to absorb a frequency difference, a synchronization buffer for absorbing the frequency difference is used.

For example, a circuit in which IP_A operating at a frequency of CLK_A and IP_B operating at a frequency of CLK_B are coupled will be described. A synchronization circuit that is a circuit which absorbs a frequency difference from IP_A is disposed in IP_B. Data is transferred from IP_A to IP_B together with a validation signal. The transferred data is written to a synchronization buffer entry indicated by a write pointer (WP) of IP_B. The validation signal increments WP. The validation signal is synchronized to CLK_B through a synchronization flip flop (FF), and a read pointer (RP) is incremented by the validation signal. The data is taken out of the synchronization buffer indicated by the RP. Since it is guaranteed that a validation flag is synchronized to CLK_B, data taken out of the synchronization buffer indicated by RP is also synchronized to CLK_B. The synchronization buffer is a first in first out (FIFO) buffer in many cases.

The data taken out of the synchronization buffer is held in a data buffer indicated by BWP which is a write pointer in a subsequent stage, and is read from an entry indicated by BRP which is a read pointer in the subsequent stage. Reading and writing from and to the data buffer are not performed through the FIFO. The number of entries in the data buffer is equal to the outstanding number of IP_A and IP_B. Since an interval between IP_A and IP_B is managed by the outstanding number, IP_B transmits a release (RLS) signal to IP_A when data is taken out of the data buffer. The RLS signal is synchronized to CLK_A from CLK_B through the synchronization FF and is notified to the IP_A. Thus, the outstanding management of IP_A and IP_B is achieved. Such a circuit is applied to, for example, a circuit in which IP_A is a central processing unit (CPU) core and IP_B is a memory controller.

In recent years, a circuit size of the SoC has been increased to achieve a large number of functions, and thus it is desirable to achieve a circuit with resource saving.

As a data synchronization technique, there has been proposed a technique of the related art for reducing a circuit size by replacing a synchronization buffer for storing data with two types of address buffers. Examples of the related art include Japanese Laid-open Patent Publication No. 10-340130.

SUMMARY

According to an aspect of the embodiments, a synchronization method in a semiconductor apparatus including a synchronization buffer, a data buffer and a FIFO, the method includes: storing data write pointers in a line through the FIFO; storing data input from an input source at a first frequency at a location in the data buffer designated by the data write pointer at one end of the line; taking out the data write pointer at the one end from the line to store the data write pointer in the synchronization buffer; synchronizing a validation signal input together with the data from the input source, at the first frequency, to a second frequency; reading out the data write pointer stored in the synchronization buffer when the validation signal is synchronized, and adding completion information that indicates completion of synchronization to the data stored at the location in the data buffer designated by the read out data write pointer; and reading out, from the data buffer, the data to which the completion information is added, for further processing The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In an interface managed by the outstanding number including a synchronization circuit in the related art, the capacity of the data buffer increases in proportion to a frequency difference and a data width, for example. This is because the number of entries of the synchronization buffer increases when the frequency difference is large, and the buffer capacity per entry of the synchronization buffer increases when the data width is large. Therefore, it is difficult to reduce the circuit size in the configuration using the synchronization buffer and the data buffer.

In view of the above, an object of the disclosed technique is to provide a semiconductor apparatus and a synchronization method that reduce a circuit size.

Hereinafter, embodiments of a semiconductor apparatus and a synchronization method disclosed in the present application will be described in detail with reference to the drawings. The semiconductor apparatus and the synchronization method disclosed in the present application are not limited to the following embodiments.

Embodiment 1

Figure 1:
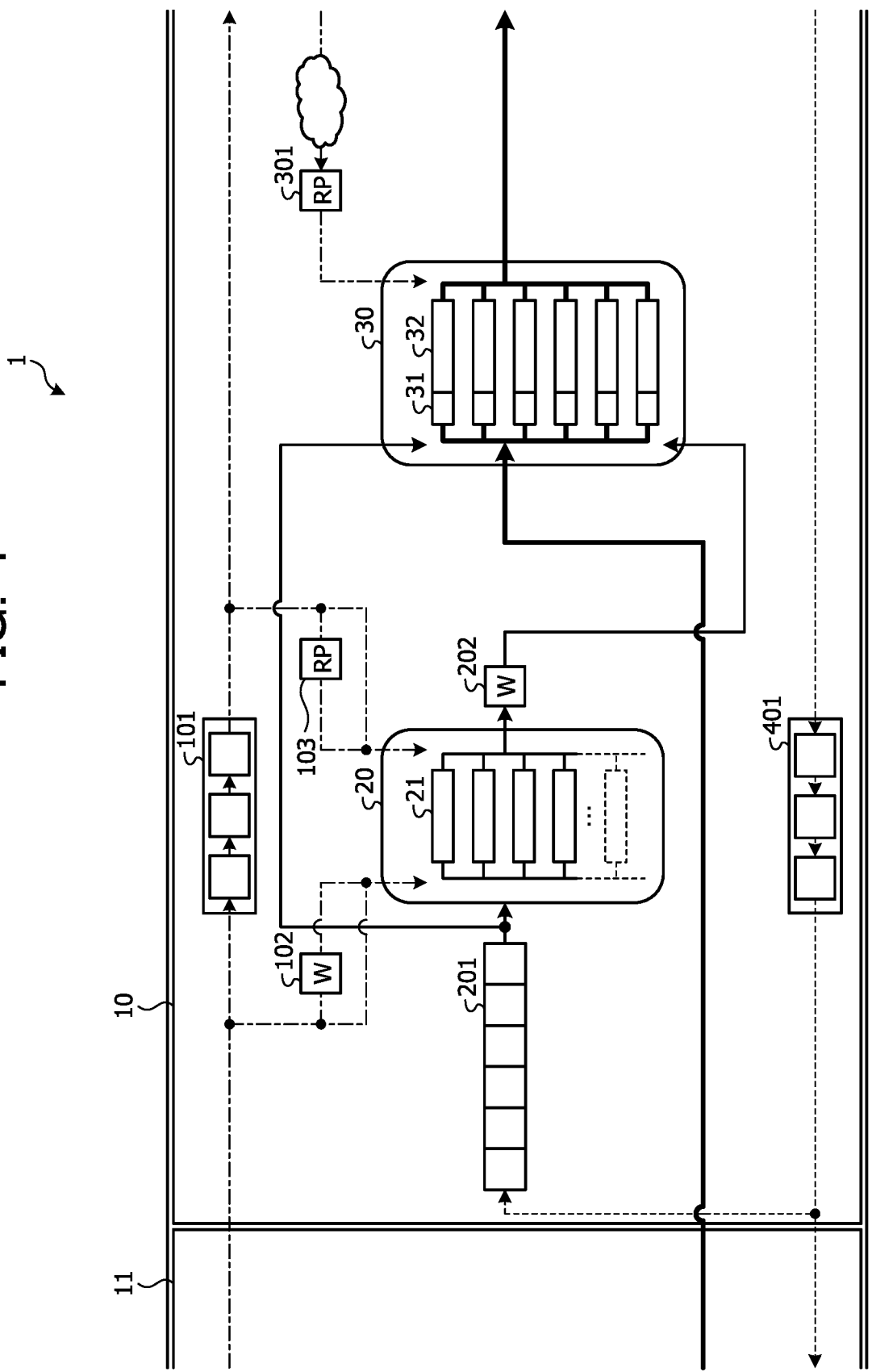
FIG. 1 is a circuit configuration diagram of a semiconductor apparatus.

FIG. 1 is a circuit configuration diagram of a semiconductor apparatus. As illustrated in FIG. 1, the semiconductor apparatus 1 has IPs 10 and 11 in the semiconductor apparatus 1. The IP 10 operates at a frequency of CLK_B. The IP 11 operates at a frequency of CLK_A. A case where data is transmitted from the IP 11 to the IP 10 will be described.

The IP 11 outputs data and a validation signal to the IP 10. The data passes through a path represented by a bold line in FIG. 1. The validation signal passes through a path represented by a broken line (one dot chain line). The data and the validation signal are output from the IP 11 at the frequency of CLK_A.

The synchronization buffer 20 according to the present embodiment stores a data write pointer designating a data write destination to the data buffer 30. The synchronization buffer 20 has a plurality of entries 21 for storing data write pointers one by one. An entry 21 as the write destination of the data write pointer with respect to the synchronization buffer 20 is designated by a write pointer 102. The entry 21 from which the data write pointer with respect to the synchronization buffer 20 is read is designated by a read pointer 103.

The write pointer (WP) 102 is a pointer which indicates the entry 21 as the write destination of the data write pointer in the synchronization buffer 20. The write pointer 102 is incremented by the validation signal input from the IP 11. By being incremented, the write pointer 102 points to the entry 21 as a storage destination of the data write pointer in the synchronization buffer 20 by shifting the entry one by one. After the increment of the write pointer 102, the writing to the synchronization buffer 20 is validated by the validation signal.

The FIFO buffer 201 is a storage circuit that stores a data write pointer which indicates a write destination to the data buffer 30 and processes the stored data write pointer by first in first out. The FIFO buffer 201 designates an entry 32 as a data storage destination in the data buffer 30 by a head data write pointer.

When writing to the synchronization buffer 20 is permitted by the validation signal, the FIFO buffer 201 stores the head data write pointer in the entry 21 of the synchronization buffer 20 designated by the write pointer 102. After storing the data write pointer in the synchronization buffer 20, writing to the synchronization buffer 20 becomes invalid.

When data is stored in all the entries 21 of the data buffer 30, and the data is output from the data buffer 30, the FIFO buffer 201 performs the following operation. The FIFO buffer 201 receives, from a synchronization FF 401, an input of an entry number of an empty entry that is the entry 21 in which the data output from the data buffer 30 has been stored. The FIFO buffer 201 stores the input entry number as a data write pointer in the last stage.

As described above, in a state where all the entries 21 in the data buffer 30 are filled, a new data write pointer is stored in the FIFO buffer 201 after data reading, and thus data between the IP 11 and the IP 10 may be managed by the outstanding number.

A synchronization FF 101 has a plurality of flip flops (FFs). The synchronization FF 101 receives an input of the validation signal output from the IP 11. The synchronization FF 101 synchronizes a validation flag signal to CLK_B by transferring the validation flag signal via the held multistage flip flops. The synchronization FF 101 outputs the validation signal synchronized to the CLK_B to the read pointer (RP) 103. The synchronization FF 101 outputs a validation signal synchronized to the CLK_B to a circuit in a subsequent stage (not illustrated) that performs other processing such as arithmetic calculation of the IP 10.

The read pointer 103 is a pointer which indicates an entry 21 as a write destination of the data write pointer in the synchronization buffer 20. The read pointer 103 is incremented by the validation signal output from the synchronization FF 101. By being incremented, the read pointer 103 points to the entry 21 from which the data write pointer in the synchronization buffer 20 is read by shifting the entry one by one. After the increment of the read pointer 103, the reading from the synchronization buffer 20 is validated by the validation signal.

By writing and reading the data write pointer to and from the synchronization buffer 20 while sequentially incrementing the write pointer 102 and the read pointer 103, the processing of the data write pointer in an order of storage in the synchronization buffer 20 is guaranteed.

The data buffer 30 is a storage device that stores data output from the IP 11. The data buffer 30 has a plurality of entries 32 for storing data output from the IP 11 one by one. Each entry 32 has a completion flag 31 that indicates the completion of the synchronization. An initial value of the completion flag 31 is a value representing non-synchronization.

The entry 32 as a data write destination with respect to the data buffer 30 is designated by a data write pointer stored at the head of the FIFO buffer 201. The data output from the IP 11 is stored in the entry 32 designated by the data write pointer stored at the head of the FIFO buffer 201 in the data buffer 30.

The designation of the entry 32 from which data is read with respect to the data buffer 30 is performed by the read pointer 301. The designation of the completion flag 31 of which a value is changed is performed by the data write pointer held by the write pointer 202.

The write pointer 202 is a pointer which indicates the completion flag 31 of which a value is changed in the data buffer 30. The write pointer 202 acquires the data write pointer output from the synchronization buffer 20. The write pointer 202 designates the completion flag 31 of which the value is changed in the data buffer 30 by the acquired data write pointer. The value of the completion flag 31 of the data buffer 30 designated by the write pointer 202 is changed to a value representing the completion of the synchronization. Hereinafter, changing the value of the completion flag 31 to a value representing completion of synchronization is referred to as validating the completion flag 31, and changing the value of the completion flag 31 to a value representing non-synchronization is referred to as invalidating the completion flag 31.

The read pointer 301 is a pointer that designates the entry 32 from which data is read in the data buffer 30. The read pointer 301 receives an instruction to read data from a circuit in the subsequent stage that performs an arithmetic calculation or the like and designates the entry 32 storing the data to be read. For example, the read pointer 301 holds information of the entry 32 as the storage destination of each data stored in the data buffer 30. The read pointer 301 does not perform, while receiving an input of a busy signal for the address of the write destination of each data from the circuit in the subsequent stage, designation of the entry 32 for storing data to be written to the address corresponding to the busy signal. When the busy signal is stopped, it is determined that writing is possible, and the read pointer 301 designates the entry 32 for storing the writable data by pointing the pointer.

When the entry 32 is designated by the read pointer 301, in a case where the completion flag 31 added to the entry 32 designated by the read pointer 301 in the data buffer 30 is valid, data is read from the entry 32. The read data is output to the circuit in the subsequent stage that has instructed the reading. When the completion flag 31 of the designated entry 32 is valid, it is guaranteed that the validation signal is synchronized to CLK_B, and thus, it is also guaranteed that the data stored in the entry 32 is synchronized to CLK_B. When data is read from the entry 32, the completion flag 31 of the entry 32 from which the data is read in the data buffer 30 is invalidated.

On the other hand, when the completion flag 31 of the entry 32 designated by the read pointer 301 is invalid, the data stored in the entry 32 is not read until the completion flag 31 becomes valid. When the completion flag 31 of the entry 32 is invalid, it is not guaranteed that the validation signal is synchronized to CLK_B, and thus, it is not guaranteed that the data stored in the entry 32 is also synchronized to CLK_B.

The synchronization FF 401 has a plurality of flip flops. After the data is read from the data buffer 30, the synchronization FF 401 receives an input of the entry number of the empty entry from which the data has been read, together with the release (RLS) signal. The synchronization FF 401 synchronizes the release signal to CLK_A by transferring the release signal and the entry number of the empty entry via the held multistage flip flops.

The synchronization FF 401 outputs the release signal synchronized to CLK_A to the IP 11. The synchronization FF 401 outputs the entry number of the empty entry to the FIFO buffer 201. Thus, all the entries 21 in the data buffer 30 may be evenly used.

Figure 2:
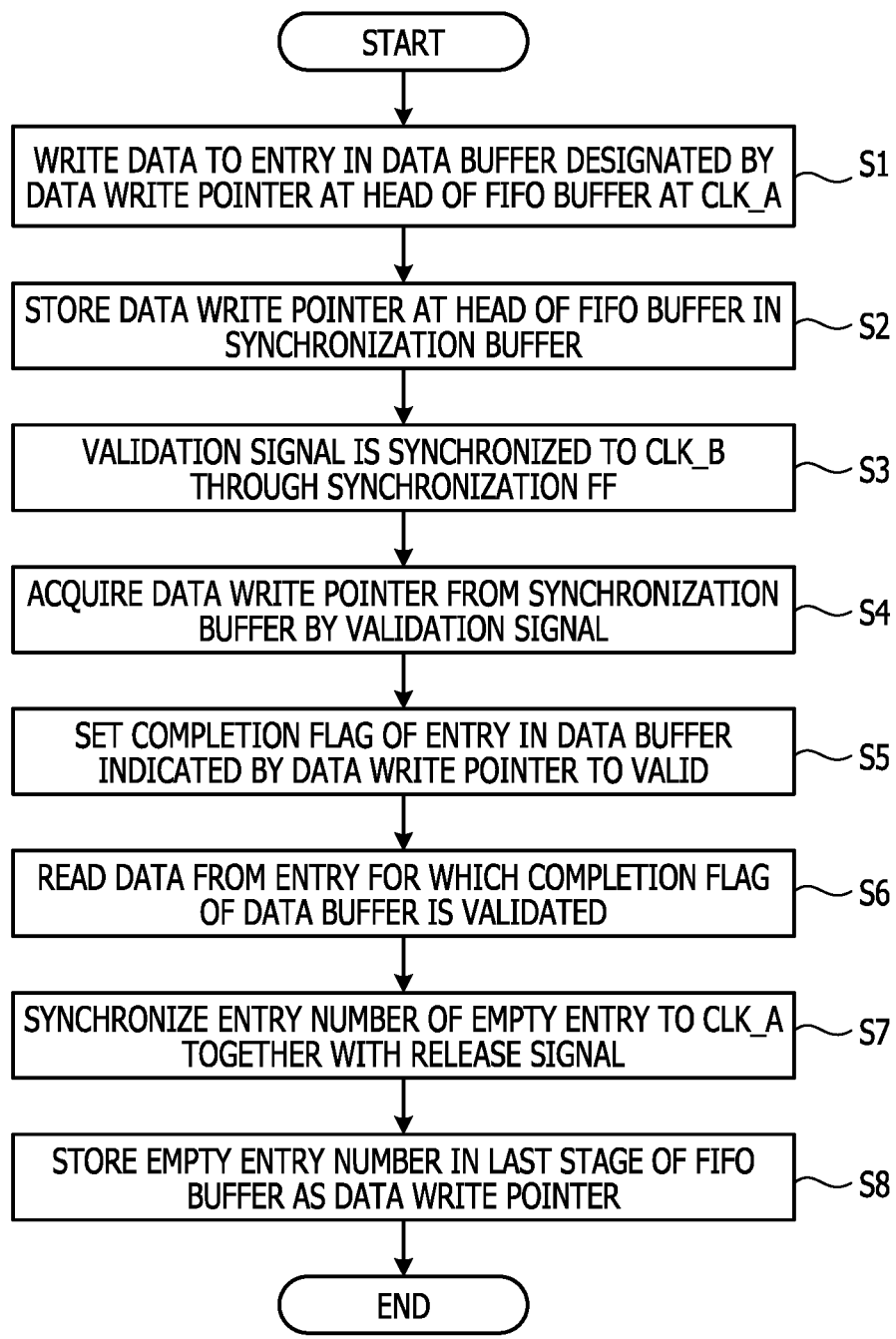
FIG. 2 is a flowchart of synchronization processing by a semiconductor apparatus according to Embodiment 1.

Next, a flow of data synchronization processing by the semiconductor apparatus 1 according to the present embodiment will be described with reference to FIG. 2. FIG. 2 is a flowchart of the synchronization processing by the semiconductor apparatus according to Embodiment 1. A case where one entry 32 among the entries 32 of the data buffer 30 is an empty entry will be described.

The data output from the IP 11 is written at CLK_A to the entry 32 in the data buffer 30 designated by the data write pointer at the head of the FIFO buffer 201 (step S1).

The write pointer 102 is incremented by the validation signal. When the writing is validated by the validation signal, a data write pointer at the head of the FIFO buffer 201 is stored in the entry 21 designated by the write pointer 102 in the synchronization buffer 20 (step S2).

The validation signal is synchronized to CLK_B through the synchronization FF 101 (step S3). The validation signal synchronized to CLK_B increments the read pointer 103. The validation signal synchronized to CLK_B validates the reading from the synchronization buffer 20.

When the reading from the synchronization buffer 20 is validated by the validation signal, the write pointer 202 acquires the data write pointer from the entry 21 of the synchronization buffer 20 designated by the read pointer 103 (step S4).

The completion flag 31 of the entry 32 in the data buffer 30 designated by the data write pointer acquired by the write pointer 202 is set to be valid (step S5).

Upon receiving an instruction to read data, the read pointer 301 designates the entry 32 storing the designated data in the data buffer 30. Data is read from the entry 32 for which the completion flag 31 is validated among the entries 32 designated by the read pointer 301 (step S6).

The synchronization FF 401 synchronizes the entry number of the empty entry in the data buffer 30 to CLK_A together with the release signal (step S7).

The FIFO buffer 201 receives the input of the entry number of the empty entry from the synchronization FF 401. The FIFO buffer 201 stores the acquired entry number in the last stage as a data write pointer (step S8).

Figure 3:
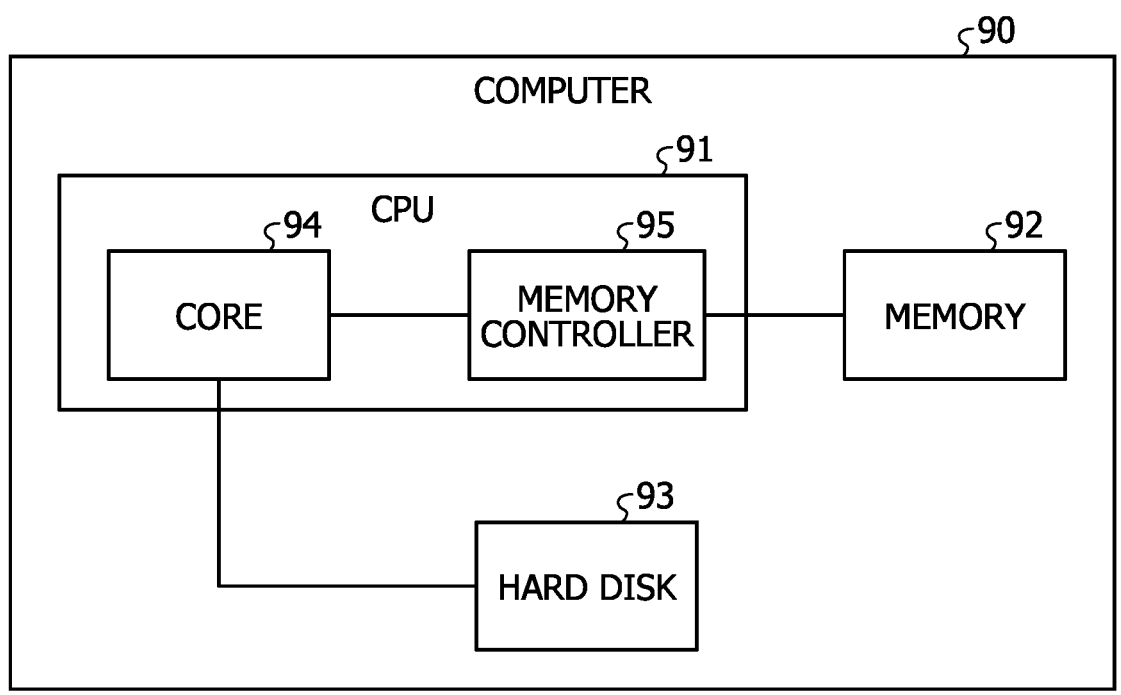
FIG. 3 is a diagram for explaining an application example of a semiconductor apparatus according to Embodiment 1.

FIG. 3 is a diagram for explaining an application example of the semiconductor apparatus according to Embodiment 1. The semiconductor apparatus 1 according to the present embodiment is designed as a part of a circuit of a computer 90, for example. The computer 90 in FIG. 3 has a CPU 91, a memory 92, and a hard disk 93. The CPU 91 is coupled to the memory 92 and the hard disk 93 via a bus.

The CPU 91 has a core 94 and a memory controller 95. The core 94 is a circuit that performs arithmetic processing. The memory controller 95 is a control circuit that reads and writes data from and to the memory 92 in accordance with a command from the core 94.

For example, the IP 11 according to Embodiment 1 is a circuit serving as a communication interface with the memory controller 95 in the core 94. The IP 10 is a circuit serving as a communication interface with the core 94 in the memory controller 95.

In the following case, a comparison between the semiconductor apparatus 1 according to the present embodiment and a configuration in which data is stored in the synchronization buffer will be described. For example, a data width of data transmitted from the core 94 to the memory controller 95 is 128 bits. The number of entries 21 in the synchronization buffer 20 is 24. The size of the data write pointer is 6 bits, and the number of data write pointers that the FIFO buffer 201 is able to hold is 64.

In this case, the size of the synchronization buffer is 128 bits×24=3072 bits in the configuration in which data is stored in the synchronization buffer. In contrast, in the semiconductor apparatus 1 according to the present embodiment, the size of the FIFO buffer 201 is, 6 bits×64=384 bits. The size of the synchronization buffer 20 is, 6 bits×24=144 bits. For example, in a case of the semiconductor apparatus 1 according to the present embodiment, the FIFO buffer 201 and the synchronization buffer 20 have a total of 528 bits.

For example, the ratio of the size of the synchronization buffer in the configuration in which data is stored in the synchronization buffer to the total size of the FIFO buffer 201 and the synchronization buffer 20 of the semiconductor apparatus 1 according to the present embodiment is, 528 bits/3072 bits=17.2%. Therefore, the semiconductor apparatus 1 according to the present embodiment may reduce the circuit size to approximately 17% of the size of the configuration in which data is stored in the synchronization buffer.

When the frequency difference is large, the number of entries 21 in the synchronization buffer 20 is increased. However, since the size of one entry 21 is small, even when the number of entries 21 increases, the semiconductor apparatus 1 may be designed with resource saving as compared with the configuration in which data is stored in the synchronization buffer 20.

A case where the following conditions are added to the above conditions will be described. For example, the number of stages of the synchronization FF 101 is five. An operating frequency of the IP 11 is 6 GHz, and an operating frequency of the IP 10 is 1 GHz. In this case, the number of entries of the synchronization FF 401 is, 5×(6 GHz/1 GHz)=30.

In this case, the size of the synchronization buffer is, 128 bits×30=3840 bits in the configuration in which the synchronization buffer stores the data. In contrast, in the semiconductor apparatus 1 according to the present embodiment, the size of the FIFO buffer 201 is, 6 bits×64=384 bits. The size of the synchronization buffer 20 is, 6 bits×30=180 bits. For example, in a case of the semiconductor apparatus 1 according to the present embodiment, the FIFO buffer 201 and the synchronization buffer 20 have a total of 564 bits.

For example, the ratio of the size of the synchronization buffer in the configuration in which data is stored in the synchronization buffer to the total size of the FIFO buffer 201 and the synchronization buffer 20 of the semiconductor apparatus 1 according to the present embodiment is, 564 bits/3840 bits=14.7%. Therefore, the semiconductor apparatus 1 according to the present embodiment may reduce the circuit size to approximately 15% of the size of the configuration in which data is stored in the synchronization buffer.

As described above, when data is transmitted and received between IPs that operate at different frequencies, the semiconductor apparatus according to the present embodiment stores, in the synchronization buffer, a pointer that indicates a storage destination of input data in the data buffer. The semiconductor apparatus reads the pointer from the synchronization buffer in accordance with the synchronized validation signal, identifies data for which the synchronization is guaranteed by completing the synchronization of the validation signal by the read pointer, and reads the data for which the synchronization is guaranteed from the data buffer. In many cases, a bit width of the write pointer is smaller than a bit width of data. Therefore, since the write pointer having a small size is stored in the synchronization buffer and the data itself is stored in the data buffer, the size of the synchronization buffer may be reduced, and the circuit size of the semiconductor apparatus may be reduced.

Embodiment 2

Next, Embodiment 2 is described. In Embodiment 1, a case where data is transmitted from an IP having a high operating frequency to an IP having a low operating frequency has been described. However, even in a case where data is transmitted from an IP having a low operating frequency to an IP having a high operating frequency, a configuration in which the data write pointer is stored in the synchronization buffer may be used. The semiconductor apparatus according to the present embodiment is also illustrated in the circuit configuration diagram of FIG. 1.

A validation signal having a high frequency is synchronized to a low frequency by the synchronization FF 101. The data write pointer is read from the synchronization buffer 20 by using the validation signal synchronized to the low frequency. The completion flag 31 of the entry 32 in the data buffer 30 designated by the read data write pointer is validated. Thus, the data that is guaranteed to be synchronized to the low frequency by the synchronization of the validation signal is read from the data buffer 30. In this manner, the semiconductor apparatus 1 according to the present embodiment may perform synchronization from a low operating frequency to a high operating frequency.

As described above, even in a case of synchronization from a low operating frequency to a high operating frequency, by using the semiconductor apparatus according to the present embodiment, the size of the synchronization buffer may be reduced, and the circuit size of the semiconductor apparatus may be reduced.

However, in a case of synchronization from a high operating frequency to a low operating frequency, since the operating frequency at the time of output of data is higher than the operating frequency at the time of input of data, the number of pieces of stagnant data is reduced. Therefore, the semiconductor apparatus according to Embodiment 1 may more effectively reduce an increase in the size of the synchronization buffer than the semiconductor apparatus according to Embodiment 2.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor apparatus comprising:
   a synchronization buffer;
   a data buffer;
   a writing circuit that stores data write pointers in a line through an FIFO, stores data input from an input source at a first frequency at a location in the data buffer designated by the data write pointer at one end of the line through the FIFO, and takes out the data write pointer at the one end of the line through the FIFO to store the data write pointer in the synchronization buffer in response to a validation signal input together with the data from the input source at the first frequency;
   a first synchronization circuit that synchronizes the validation signal to a second frequency;
   an information addition circuit that reads the data write pointer stored in the synchronization buffer in response to the validation signal that is synchronized by the first synchronization circuit, and adds completion information that indicates completion of synchronization to the data stored at the location in the data buffer designated by the read data write pointer; and
   a reading circuit that reads, from the data buffer, the data to which the completion information is added by the information addition circuit.

2. The semiconductor apparatus according to claim 1, wherein the writing circuit stores the data write pointer, that indicates a location in the data buffer where the data read by the reading circuit has been stored, at another end of the line through the FIFO.

3. The semiconductor apparatus according to claim 2, further comprising:
   a second synchronization circuit that receives, at the second frequency, the data write pointer that indicates the location in the data buffer where the data read by the reading circuit has been stored and a release signal that indicates that the data has been read, synchronizes the received data write pointer and the release signal to the first frequency, causes the writing circuit to store the data write pointer, synchronized to the first frequency, at the other end of the line through the FIFO, and transmits the release signal to the input source.

4. A semiconductor apparatus according to claim 1, wherein the first frequency is higher than the second frequency.

5. A synchronization method in a semiconductor apparatus including a synchronization buffer, a data buffer and a FIFO, the method comprising:
   storing data write pointers in a line through the FIFO;

storing data input from an input source at a first frequency at a location in the data buffer designated by the data write pointer at one end of the line through the FIFO;

taking out the data write pointer at the one end of the line through the FIFO to store the data write pointer in the synchronization buffer in response to a validation signal input together with the data from the input source at the first frequency;

synchronizing the validation signal to a second frequency;

reading out the data write pointer stored in the synchronization buffer when in response to the validation signal that is synchronized, and adding completion information that indicates completion of synchronization to the data stored at the location in the data buffer designated by the read out data write pointer; and reading out, from the data buffer, the data to which the completion information is added, for further processing.

* * * * *